United States Patent [19]

Misawa et al.

[11] 3,984,859
[45] Oct. 5, 1976

[54] HIGH WITHSTAND VOLTAGE SEMICONDUCTOR DEVICE WITH SHALLOW GROOVES BETWEEN SEMICONDUCTOR REGION AND FIELD LIMITING RINGS WITH OUTER MESA GROOVE

[75] Inventors: Yutaka Misawa; Hideyuki Yagi; Yasumichi Yasuda, all of Hitachi, Japan

[73] Assignee: Hitachi, Ltd., Japan

[22] Filed: Jan. 3, 1975

[21] Appl. No.: 538,315

[30] Foreign Application Priority Data
Jan. 11, 1974  Japan................................. 49-5978

[52] U.S. Cl................................. 357/55; 357/13; 357/38; 357/52; 357/56
[51] Int. Cl.².......................................... H01L 29/06
[58] Field of Search ................... 357/52, 55, 56, 38, 357/13

[56] References Cited
UNITED STATES PATENTS

| | | | |
|---|---|---|---|
| 3,335,296 | 8/1967 | Smart................... | 357/38 |
| 3,391,287 | 7/1968 | Kao et al. ............. | 357/52 |
| 3,445,303 | 5/1969 | Engbert................ | 357/56 |
| 3,506,502 | 4/1970 | Nakamura........... | 357/56 |
| 3,535,774 | 10/1970 | Baker.................. | 357/52 |
| 3,538,398 | 11/1970 | Whiting............... | 357/52 |
| 3,555,373 | 1/1971 | Kawana et al. ..... | 357/13 |
| 3,608,186 | 9/1971 | Hutson................ | 357/52 |
| 3,751,722 | 8/1973 | Richman............. | 357/52 |
| 3,821,782 | 6/1974 | Hutson................ | 357/56 |
| 3,832,246 | 8/1974 | Lynch................. | 357/13 |

*Primary Examiner*—William D. Larkins
*Attorney, Agent, or Firm*—Craig & Antonelli

[57] ABSTRACT

In a high-withstand-voltage (high-breakdown voltage) semiconductor device in which the main PN junction is of planar structure and a field limiting ring region is provided outside and around the exposed end of the main PN junction, a groove is formed between the main region to form the main PN junction and the field limiting ring region, the bottom of which groove is shallower than that of each of the regions and in the surface of which groove the end of the main PN junction and one of the ends of the PN junction between the field limiting ring region and the substrate are exposed, and the other end of the PN junction between the field limiting ring region and the substrate is exposed in the surface of another groove whose bottom is deeper than that of the field limiting ring region.

8 Claims, 13 Drawing Figures

HIGH WITHSTAND VOLTAGE SEMICONDUCTOR DEVICE WITH SHALLOW GROOVES BETWEEN SEMICONDUCTOR REGION AND FIELD LIMITING RINGS WITH OUTER MESA GROOVE

BACKGROUND OF THE INVENTION

1. Field of the Invention

The present invention relates to a high-withstand-voltage (high-breakdown voltage) semiconductor device whose main PN junction has a planar structure.

2. Description of the Prior Art

Depending upon the structure of the PN junction, semiconductor devices are classified into the planar type, the mesa type and the bevel type. The planar type has the structure in which all the PN junction ends are exposed in one principal surface of a semiconductor substrate. The mesa type has the structure in which the PN junction end is exposed in an etcheddown surface at the peripheral edge of one principal surface. The bevel type has the structure in which the PN junction end is exposed in a side end surface connecting a pair of principal surfaces, and in which the side end surface intersects the PN junction at an acute angle in some cases and orthogonally in other cases. The planar and mesa types are suitable in the case of forming a number of semiconductor pellets from a semiconductor wafer having a large area, and accordingly they are mainly applied to semiconductor devices requiring only small power. The bevel type is suitable for a high power semiconductor device since it uses a semiconductor substrate large in area as compared with those of the planar and mesa types. From the viewpoint of fabrication, the planar type requires only the diffusion operation, while the mesa type additionally needs the operation of etching down. The bevel type involves an operation for bringing individual devices into the bevel shape. The ease of fabrication is in the order of the planar type, the mesa type and the bevel type.

On the other hand, since the PN junction exposed in the surface of the semiconductor substrate is susceptible to the influence of the atmosphere, it must be stabilized against this influence by covering it with insulating material. The insulating covering is called the passivation film. In the planar and mesa types of semiconductor devices, the passivation film can be formed before splitting the large area semiconductor wafer into many semiconductor pellets, and the efficiency in the formation of the passivation film is excellent. In contrast, in the bevel type of semiconductor device, the passivation film must be formed after such a splitting process. In order to precisely form the passivation film on the small area semiconductor pellets, a high degree of accuracy and much labor are required, so that the bevel type is materially inferior in fabrication efficiency to the planar and mesa types.

A discussion will now be present on the withstand (breakdown) voltages of the respective types. The bevel type can readily achieve a high withstand voltage in such a way that the angle of inclination of the side end surface in which the PN junction is exposed is so set as to make large the sectional area of a region of high impurity concentration which sectional area is taken parallel to the PN junction, namely in such a manner as forming a so-called positive bevel. Moreover, the angle of inclination is 15° – 60° with respect to the PN junction, and the angle does not make the semiconductor substrate become large-sized.

The mesa type has a lower withstand voltage than the bevel type because the surface in which the PN junction is exposed has a negative bevel, that is, the inclined surface is such that the sectional area of a region on the high impurity concentration side relative to the PN junction, which sectional area is taken parallel to the PN junction, becomes small. With the mesa type, a withstand voltage of nearly 900 (V) is attained. In order to attain even higher withstand voltages, the angle of inclination at the position where the PN junction is exposed needs to be made small. The negative bevel has the nature that, as the angle between the inclined surface and the PN junction or the angle of inclination is smaller, the withstand voltage can be made higher. For this reason, in the case of, for example, a thyristor, a PN junction of the positive bevel and a PN junction of the negative bevel are obtained by making the side end surface inclined, the inclination angle of the positive bevel and that of the negative bevel are made different. In the positive bevel the inclination is 15° – 60° as mentioned previously, while in the negative bevel it is 1° – 2°. Accordingly, if a high withstand voltage is intended in the mesa type, the angle of inclination must be made nearly 1° – 2°, so that the size of the semiconductor sustrate becomes very large for a desired conduction current. Also, the withstand voltage is limited far below a desirable level.

In the planar type, the PN junction has a bent portion, at which the field concentrates. Since the impurity concentrations on both sides of the PN junction at its exposed part are high, the spread of a depletion layer becomes small around the exposed part. Due to these facts, it is difficult to obtain a semiconductor device having a high withstand voltage. The withstand voltage attained by the planar type is usually 300 – 400 (V). If a higher withstand voltage is intended with the planar type, a region termed the field limiting ring must be formed on the periphery of the exposed PN junction part, spaced from the PN junction and surrounding it. The withstand voltage as accomplished by the semiconductor device with one field limiting ring is 300 – 400 (V), and the number of the field limiting rings is determined in compliance with a desired rating withstand voltage. Accordingly, as the withstand voltage becomes higher, the number of the field limiting rings increases, which leads to the disadvantage that the semiconductor substrate becomes large-sized for a desired conduction current. The PN junction of the planar type is produced in such a way that the selective diffusion is performed using as a mask an oxide film formed on the semiconductor wafer surface. Since it is difficult to form the oxide film perfectly free from pinholes, diffusion may take place in undesirable portions of the substrate due to the pinholes. Where the diffusion through a pinhole takes place in the surface between the PN junction and the field limiting ring, a depletion layer does not spread to the field limiting ring, and the portion of the diffusion through the pinhole breaks down, so that the desired withstand voltage cannot be acquired. Further, in the planar type semiconductor device, the oxide film used for the mask of the selective diffusion is usually employed as the surface passivation film as it is. Therefore, where the pinholes exist in the oxide film, the semiconductor device is affected by the atmosphere and tends to bring about a degradation in the withstand voltage.

In a planar type semiconductor device which is resin-molded, there is a disadvantage as stated below. With the planar type, it is difficult to thickly form the oxide film as the surface passivation film in view of the generation of cracks and degradation in the precision of mask registration and selective etching. In the device whose withstand voltage is 400 – 500 (V) or higher, an electric field extends even outside the oxide film due to its thinness. Water having permeated through the resin is electrolyzed by the electric field, and the ions thus produced are stuck onto the surface of the oxide film and create an induced channel in the vicinity of the surface of the semiconductor substrate. The induced channel causes leakage current in the device, and makes it impossible to attain a desired withstand voltage.

SUMMARY OF THE INVENTION

An object of the present invention is to provide a novel high-withstand-voltage semiconductor device which is free from the various disadvantages stated above.

According to the present invention which has been made to attain the above mentioned object, there is provided a high-withstand-voltage semiconductor device comprising a semiconductor substrate having a pair of principal surfaces opposite to each other; a first region having a conductivity type opposite to that of the substrate, formed in planar structure in a selected portion of one of the principal surfaces of the substrate; and at least one second region in the form of a ring, enclosing the first region (i.e. field limiting ring), wherein one or more annular grooves are formed between the first and second regions or between the first and second regions and between the second regions themselves, the bottoms of the annular grooves being shallower than those of the first and second regions, and the ends of the PN junctions between the first region and the substrate and between the second regions and the substrate being exposed in the surface of the annular grooves, and wherein the end of the PN junction between the second region and the substrate or between the substrate and the outermost one of the second regions, which end lies parallel to the one principal surface of the substrate, is exposed in the outer periphery of the second region or the outermost one of the second regions.

The present invention will be described in further detail, concerning its structural features. In the selected portions of one of the principal surfaces of a semiconductor substrate are formed a first region and at least one second region around the first region, the first and second regions having a conductivity type opposite to that of the substrate and PN junctions being formed between the first region and the substrate and between the second region and the substrate. The second region is located within bounds up to which the depletion layer formed when the main PN junction breaks down extends in one of the principal surfaces. Accordingly, the apparent breakdown voltage of the main PN junction is made equal to the sum of the intrinsic breakdown voltage of the main PN junction and the breakdown voltage of the PN junction between the second region and the substrate so that the withstand voltage of the device can be actually increased. In addition to this configuration, according to the present invention, a groove is cut between the first and second regions, the bottom of which is shallower than those of the first and second regions; the ends of the main PN junction and the PN junction between the second region and the substrate are exposed in the surface of the groove; the end of the PN junction between the second region and the substrate, lying parallel to the one principal surface of the substrate, is exposed in the side surface on the outer periphery of the second region; and all the exposed ends of the PN junctions are covered with insulating material. By virtue of the groove, the undesirable diffusion through pin holes which may exist in the oxide film lying between the first and second regions can be prevented and, moreover, the filling of the groove with insulating material provides a thick surface passivation film completely free of pin holes. Since the thick passivation film protects the ends of the PN junctions, the device is hardly affected by the atmosphere in which it is placed. Even if the device is resin-molded, no electric field appears outside the surface passivation film and water having penetrated the resin layer is not polarized. Since the bottom of the groove is shallower than those of the first and second regions so as not to block the extension of the depletion layer of the main PN junction, the second region is not disturbed from serving as a field limiting ring. In the case where the device has more than one second region, the end of the PN junction between the outermost second region and the substrate, lying parallel to the principal surface, is exposed in the side surface on the periphery of the outermost second region to form the device in mesa structure, so that the device can have a higher withstand voltage and a smaller size than in a planar structure. Therefore, according to the present invention, there can be obtained a high-withstand-voltage semiconductor device which has its main PN junction formed in planar structure and which is free from drawbacks typical of the conventional device.

Further, according to the present invention, there can be obtained the following merits. Namely, since the oxide film on the surface of the substrate need not be made thick, the electrodes can be easily formed with high accuracy. In addition, since a part of the second region is left in one of the principal surfaces of the substrate, an induced channel, even if created, can be blocked by that part of the second region. In case where the second region does not appear exposed in the principal surface by appropriately forming a groove, an induced channel may be created due to the decrease in the impurity concentration in the surface of the second region. If an induced channel is formed near the surface of the second region, the second region becomes useless. For this reason, according to the present invention, a part of the second region is left exposed in the principal surface of the substrate so that the influence of the induced channel may be elminated. This is one of the gists of the present invention. Another important point in the present invention is that the stress in the insulating material filling the groove can be reduced. Glass and other innorganic materials can be used as the insulating material forming the passivation film, but these materials have thermal expansion coefficients greater than that of the semiconductor substrate so that if the width of the groove is large the stress caused in the insulating material due to thermal contraction will make the material peel off or crack or make the semiconductor substrate bend. The present invention suggests that if the width of the groove is minimized and if a part of the second region is left exposed in the principal surface of the substrate, the stress created in the insulating material can be reduced. The effect of the suggested structure is best manifested in the case where only one second region is formed and another groove is formed around the second region and in the case where a plurality of second regions are formed and grooves are formed between the second regions.

The second region, mentioned above, in the form of a ring need not be shaped in a continuous circle but can be in the form of interrupted circle. Namely, it is only necessary that the depletion layer formed when the main PN junction is reverse-biassed should form a continuous circle. Moreover, it is preferable that the groove has the form of a continuous circle. Further, the present invention can be applied to a diode, a transistor, thyristor etc. if one of the PN junctions contributing to the semiconductor device is of planar structure with respect to the principal surface of the substrate. In the case of a thyristor, where the PN junctions in planar structure are exposed in both the principal surfaces of the substrate, both the principal surfaces should preferably be provided with second regions and grooves in the form of rings.

Another important thing in this invention is the filling of the groove with insulating material. In this specification, by the word "filling" is meant a word "coating". It is therefore necessary to coat the surface of the groove with an insulating film having a predetermined thickness (thick enough to prevent the polarization effect due to leakage electric field). It is preferable that the insulating film should have a thickness more than $3\mu$ but less than the depth of the first or second region. An additional important feature of this invention is that the end of the PN junction between the second region and the substrate, lying parallel to the principal surface of the substrate, is exposed on the periphery of the second region. This can be done by cutting an annular groove around the second region, the bottom of which is deeper than that of the second region or by causing the end of the PN junction to appear exposed in the side surface of the substrate. In both cases, the exposed end of the PN junction should be coated with an insulating material.

BRIEF DESCRIPTITON OF THE DRAWING

DESCRIPTION OF THE PREFERRED EMBODIMENTS

Figure 1:
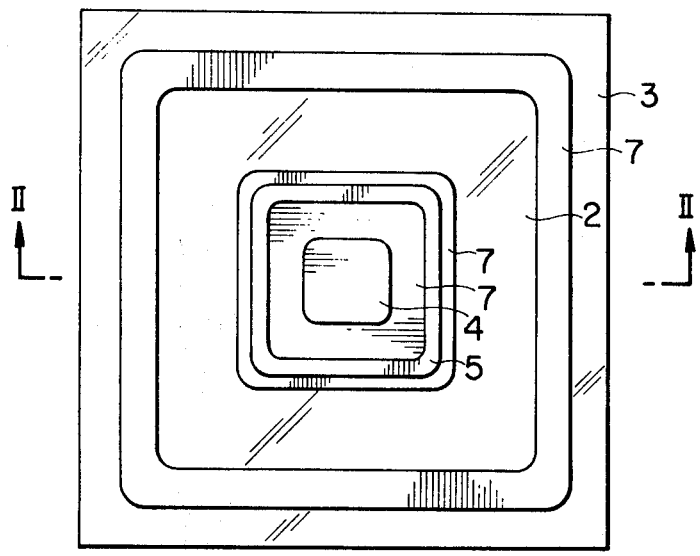
FIG. 1 shows a plan view of a high-withstand-voltage semiconductor device as one embodiment of the present invention.
Figure 2:
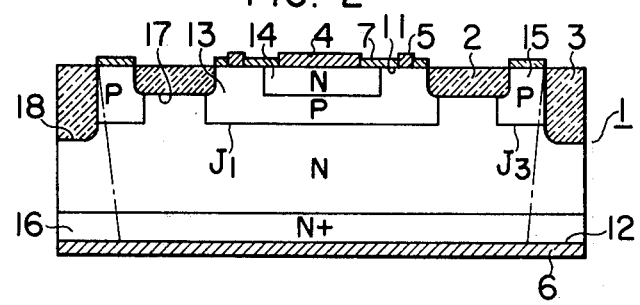
FIG. 2 shows a cross sectional view taken along line II—II in FIG. 1.

In FIGS. 1 and 2 showing respectively a plan view and a cross-sectional view of an NPN transistor fabricated according to the present invention, reference numeral 1 indicates an N-type semiconductor substrate; 11 and 12 a pair of principal surfaces of the substrate 1, located opposite to each other; 13 a P-type base region formed through, for example, selective diffusion in a selected portion of the principal surface 11; 14 an N-type emitter region formed through, for example, selective diffusion in the base region 13, with its surface exposed in the principal surface 11; 15 a P-type ring-shaped region so formed as to enclose the base region 13 on the periphery thereof and to serve as a field limiting ring; 16 a high impurity concentration layer formed on the principal surface 12. The ring-shaped region 15 is formed within a boundary up to which the depletion layer formed when the PN junction $J_1$ defined between N-type substrate 1 and the P-type base region 13 breaks down, can extend in the principal surface 11. A ring-shaped groove 17 is cut between the base region 13 and the ring-shaped region 15 and the bottom of the ring-shaped groove 17 is shallower than those of the base region 13 and the ring-shaped region 15. The groove 17 is so cut that the ends of the PN junction $J_1$ and the PN junction $J_3$ defined between the substrate 1 and the ring-shaped region 15 are exposed in the surface of the groove 17. A ring-shaped recess 18 is cut in the principal surface 11 outside and along the ring-shaped region 15. The bottom of the annular recess 18 is deeper than that of the annular region 15 and the end of that part of the PN junction $J_3$ which is parallel to the principal surface 11 is exposed in the surface of the recess 18. The recess 18 can be replaced by a side end surface as indicated by long-and-short-dash line in FIG. 2, without any appreciable change in characteristics of the device. The groove 17 and the recess 18 are filled with glass 2 and 3. An emitter electrode 4 and a base electrode 5 are kept in ohmic contact, in the principal surface 11, with the emitter region 14 and the base region 13, respectively. A collector electrode 6 is kept in ohmic contact with the substrate 1 on the principal surface 12 and an oxide film 7 covers all the remaining exposed areas of the principal surface 11. In this way, a high-withstand-voltage semiconductor device (transistor in the above case) having such an efficiency as described above can be obtained.

Figure 3:
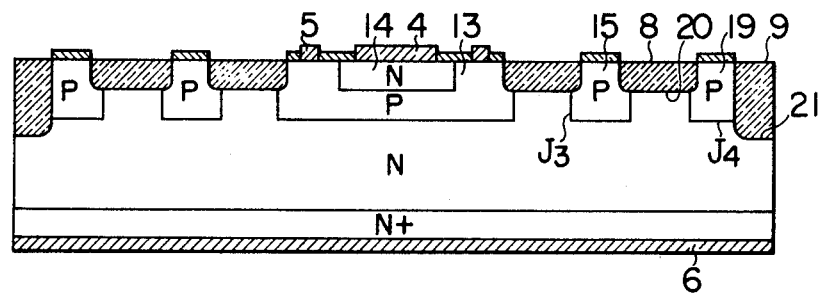
FIG. 3 shows a cross sectional view of another embodiment of the present invention.

FIG. 3 shows in cross section an NPN transistor as another embodiment of the present invention, in which two annular regions are formed, each of them being similar to the annular region 15 formed in the transistor shown in FIGS. 1 and 2. In this structure, the same reference numerals are applied to like parts as in FIGS. 1 and 2. The distance between the base region 13 and the inner annular region 15 is equal to that between the base region 13 and the annular region 15 shown in FIGS. 1 and 2. The distance between the inner annular region 15 and the outer annular region 19 is so determined that the depletion layer formed when the PN junction $J_3$ defined between the inner annular region 15 and the substrate 1 breaks down can not extend beyond the outer annular region 19. Between the inner and the outer annular regions is cut an annular groove 20, the depth of which is shallower than that of the inner or the outer annular region 15 or 19. The PN junction $J_3$ and the PN junction $J_4$, defined between the outer annular region 19 and the substrate 1, have their ends exposed in the surface of the annular groove 20. An annular recess 21 whose bottom is deeper than that of the outer annular region 19 is cut just outside and along the outer annular region 19. In the surface of the annular recess 21 is exposed the end of that portion of the PN junction $J_4$ which lies parallel to the principal surface in which all the regions are formed. The annular groove 20 and the annular recess 21 are respectively filled with glass 8 and 9. With this structure, such a function as mentioned above can be obtained and moreover by virtue of the additional annular region 19 the transistor here obtained can withstand a higher voltage than the transistor shown in FIGS. 1 and 2.

Figure 4A:
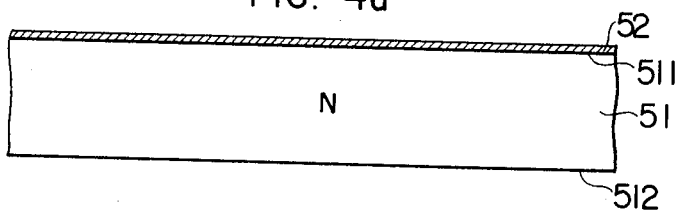
FIGS. 4a to 4h illustrate the steps of a process for manufacturing a high-withstand-voltage semiconductor device according to the present invention.
Figure 4B:
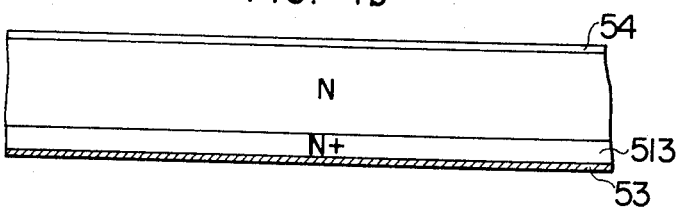
Figure 4C:
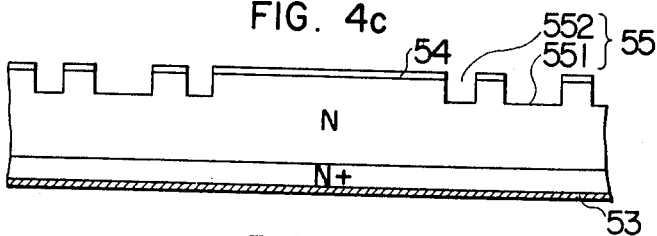

Now, the fabrication process to produce high-withstand-voltage semiconductor devices according to the present invention will be described below. FIGS. 4a to 4h illustrate the steps of the process for manufacturing a diode embodying the present invention. In the production of a high-withstand-voltage diode, an N-type, large-area semiconductor substrate 51 is prepared and an oxide layer 52 is formed on one surface 511 of the principal surfaces of the substrate 51 (FIG. 4a). Phosphorus, for example, is diffused into the other principal surface 512 to form a high concentration layer 513. Then, an oxide film 53 is formed on the layer 513 and boron, for example, is diffused to a shallow depth into the principal surface 511 at a high concentration (FIG. 4b). The high concentration diffusion layer 54 is usually called a pre-deposition layer. After the formation of the pre-deposition layer 54, grooves 55 are formed through, for example, selective etching in the principal surface 511 (FIG. 4c). The grooves 55 consist of grooves 551 to divide the semiconductor substrate into plural lattice-shaped regions and at least one annular groove 552 to enclose the divided regions. The depths of the grooves 551 and 552 are made greater than that of the pre-deposition layer 54.

Figure 4D:
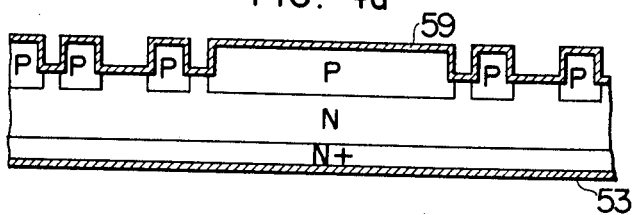
Figure 4E:
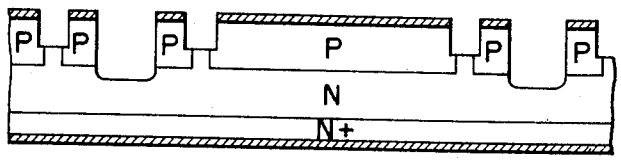
Figure 4F:
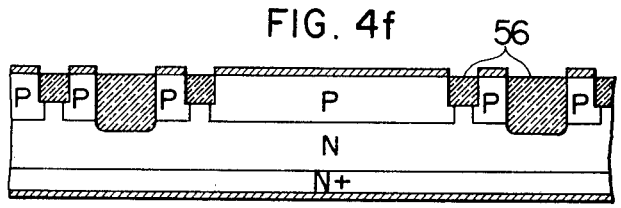
Figure 4G:
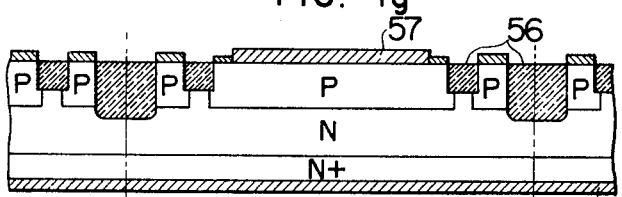
Figure 4H:
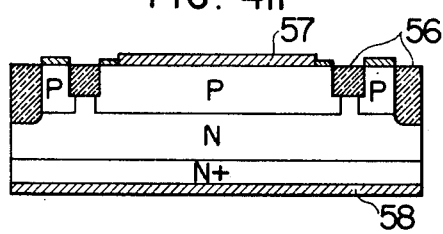

The thus prepared semiconductor substrate is heated in an atmosphere not containing such an impurity as to determine the conductivity type of the substrate and the impurity atoms in the pre-deposition layer is further diffused into the interior portion of the substrate. The depth of the extended diffusion is made deeper than the bottom of the grooves 55. In this way, a part having a function of a diode and a part enclosing the diode part and serving as field limiting ring are formed in the region divided by the groove 551 (FIG. 4d). Those portions of the oxide film 59 formed in the heating treatment for extended diffusion which cover the surfaces of the grooves 551 and 552, are removed and at the same time the bottom of the groove 551 is made deeper than the bottom of the portion forming the field limiting ring (FIG. 4e). All the grooves are filled with glass powder through electrophoresis and glass layer 56 serving as surface passivation film is formed through sintering (FIG. 4f). Thereafter, an anode electrode 57 and a cathode electrode 58 are attached onto the selected portions in the principal surfaces of the semiconductor substrate (FIG. 4g) and finally the substrate is cut along the long-and-short-dash lines to complete a high-withstand-voltage diode (FIG. 4h).

According to the above process, since the grooves are formed and the extended diffusion is performed, after the formation of the pre-deposition layer, then there can be obtained an advantage that the step of selective diffusion and the associated step of forming a mask for selective diffusion, which steps are essential for the fabrication process where grooves are formed after planar type junctions have been formed through previous selective diffusion, can be eliminated. However, if such an advantage is not expected, the semiconductor devices according to the present invention can be fabricated through various ordinary techniques.

Figure 5A:
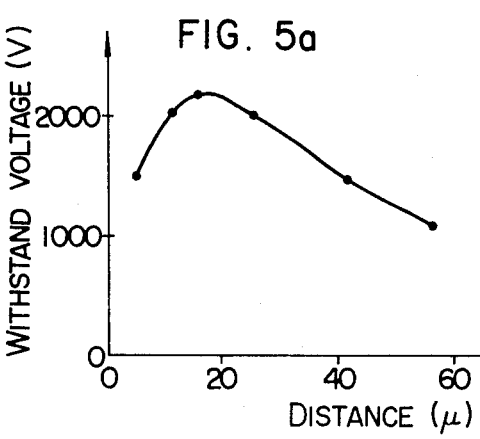
FIGS. 5a and 5b show in graphic representation the relationships between the withstand voltage and the ring-to-ring distance and between the withstand voltage and the ring-to-junction distance, the ring-to-ring distance being the space between the field limiting rings and the ring-to-junction distance a space between the field limiting ring and the main PN junction.
Figure 5B:
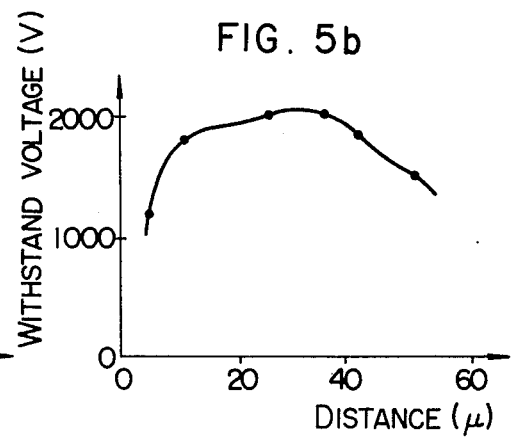

A detailed description will be made of a fact that the distances between the main PN junction and the field limiting ring and between the field limiting rings themselves can be decreased, the fact being one of the effects obtained by forming the outer periphery of the PN junction defined between the substrate and the outermost field limiting ring in mesa structure which is one of the features of the present invention. FIGS. 5a and 5b show the results of measurements in the case of a planar type diode having three field limiting rings, in each of which the voltage (withstand voltage) is plotted against the distances between the main PN junction and the innermost field limiting ring and between the field limiting rings themselves when the reverse leakage current is in excess of a predetermined value (100 μA), the distances being equal to each other and varied simultaneously by the same amount. FIG. 5a corresponds to the semiconductor device according to the present invention and FIG. 5b illustrates the case where the main PN junction and the whole field limiting rings are formed in planar structure. It is seen from these figures that the size of the device can be reduced according to the present invention and that the device according to the present invention has a higher peak of withstand voltage and therefore can withstand higher voltages.

We claim:

1. A high withstand voltage semiconductor device comprising:
   a semiconductor substrate of a first conductivity type having
   first and second principal surfaces located on opposite sides of said substrate,
   a side surface connecting said first and second principal surfaces, and
   an annular groove extending from said first principal surface to a first prescribed depth into said substrate,
   said first principal surface being divided into a first surface portion surrounded by said annular groove and a second surface portion extending outwardly from the outer periphery of said annular groove;
   a first semiconductor region of a second conductivity type, opposite said first conductivity type, formed in said first surface portion of said first principal surface, extending into said substrate to a second prescribed depth greater than said first prescribed depth, and defining with said substrate a first PN junction which terminates in said annular groove;
   a second semiconductor region of said second conductivity type formed in said second surface portion of said first principal surface, extending to a third prescribed depth greater than said first prescribed depth, surrounding said annular groove, and defining with said substrate a second PN junction, one end of which terminates in said annular groove and is spaced apart from said first PN junction within a range over which a depletion layer can spread from said first PN junction in said substrate when said first PN junction breaks down, the other end of said second PN junction terminating at said side surface; and
   insulating material disposed on the surface of said annular groove and that portion of said side surface at which said second PN junction terminates.

2. A high withstand voltage semiconductor device according to claim 1, wherein said first PN junction and said one end of said second PN junction terminate in the bottom of said annular groove.

3. A high withstand voltage semiconductor device according to claim 1, wherein said insulating material is glass.

4. A high withstand voltage semiconductor device according to claim 1, wherein said side surface is composed of
- a first side surface portion intersecting said second principal surface substantially at right angles, and
- a second side surface portion which is located between said second surface portion of said first principal surface and said first side surface portion of said side surface, to connect said portions, and is inclined relative to said second surface portion of said first principal surface, and wherein said other end of said second PN junction terminates at said second side surface portion.

5. A high withstand voltage semiconductor device comprising:
- a semiconductor substrate of a first conductivity type having
  - first and second principal surfaces located on opposite sides of said substrate,
  - a side surface connecting said first and second principal surfaces,
  - a plurality of coaxial annular grooves, each extending from said first principal surface to a first prescribed depth into said substrate,
  - said first principal surface being divided into
    - a first surface portion surrounded by said plurality of coaxial annular grooves,
    - at least one second surface portion defined between adjacent annular grooves, and
    - a third surface portion extending outwardly from the outer periphery of the outermost one of said annular grooves;
- a first semiconductor region of a second conductivity type, opposite said first conductivity type, formed in said first surface portion of said first principal surface, extending into said substrate to a second prescribed depth greater than said first prescribed depth, and defining with said substrate a first PN junction which terminates in the innermost one of said plurality of coaxial annular grooves;
- at least one respective semiconductor region of said second conductivity type disposed in said at least one second surface portion of said first principal surface, extending to a third prescribed depth greater than said first prescribed depth, and defining with said substrate at least one respective second PN junction, the opposite ends of which terminate in the adjacent annular grooves between which said at least one respective second surface portionn of said first principal surface is defined, the innermost one of said at least one respective second PN junction being spaced apart from said first PN junction by a distance such that a depletion layer extending from said first PN junction can reach said innermost one of said at least one respective second PN junction just prior to the breakdown of said first PN junction;
- a third semiconductor region of said second conductivity type disposed in said third surface portion of said first principal surface, extending to a fourth prescribed depth greater than said first prescribed depth, surrounding the outermost one of said coaxial annular grooves, and defining with said substrate a third PN junction, one end of which third PN junction terminates in said outermost one of said annular grooves and is spaced from the outermost one of said at least one respective second PN junction by a distance such that a depletion layer extending from said outermost one of said at least one respective second PN junction can reach said third PN junction just prior to the breakdown of either of said first or second PN junctions, where said at least one second PN junction is reverse-biased due to the arrival of a depletion layer extending from said first PN junction to said at least one second PN junction, the other end of which third PN junction terminates at said side surface; and
- insulating material disposed on the surfaces of said coaxial annular grooves and that portion of said side surface at which said third PN junction terminates.

6. A high withstand voltage semiconductor device according to claim 5, wherein said first PN junction, said at least one second PN junction and said one end of said third PN junction terminate at the bottom of said plurality of coaxial annular grooves.

7. A high withstand voltage semiconductor device according to claim 5, wherein said insulating material is glass.

8. A high withstand voltage semiconductor device according to claim 5, wherein the side surface of said substrate comprises a recessed side surface portion extending from the first principal surface of said substrate to a depth greater than said fourth prescribed depth and a further side surface portion extending from said recessed side surface portion to the second principal surface of said substrate, with said other end of said third PN junction terminating at said recessed side surface portion.

* * * * *